United States Patent
Park et al.

(10) Patent No.: US 12,096,654 B2
(45) Date of Patent: Sep. 17, 2024

(54) DISPLAY PANEL

(71) Applicant: SAMSUNG DISPLAY CO., LTD., Yongin-si (KR)

(72) Inventors: Ju-Chan Park, Seoul (KR); Seung-Hwan Cho, Yongin-si (KR); Sun-Ho Kim, Seongnam-si (KR); Sun-Hee Lee, Hwaseong-si (KR); Jong-Hyun Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 557 days.

(21) Appl. No.: 17/278,785

(22) PCT Filed: Sep. 20, 2019

(86) PCT No.: PCT/KR2019/012199
§ 371 (c)(1),
(2) Date: Mar. 23, 2021

(87) PCT Pub. No.: WO2020/075984
PCT Pub. Date: Apr. 16, 2020

(65) Prior Publication Data
US 2022/0045136 A1    Feb. 10, 2022

(30) Foreign Application Priority Data
Oct. 12, 2018 (KR) .................. 10-2018-0121480

(51) Int. Cl.
*H01L 27/32* (2006.01)
*G09G 3/3266* (2016.01)
(Continued)

(52) U.S. Cl.
CPC ......... *H10K 59/121* (2023.02); *G09G 3/3266* (2013.01); *H10K 50/84* (2023.02); *H10K 59/131* (2023.02)

(58) Field of Classification Search
CPC ............... G09G 3/3266; G09G 3/3233; G09G 2300/0426; G09G 2310/0281;
(Continued)

(56) References Cited

U.S. PATENT DOCUMENTS 8,796,921 B2   8/2014  Nam
9,276,055 B1   3/2016  Son et al.
(Continued)

FOREIGN PATENT DOCUMENTS

CN    108389881 A    8/2018
KR    1020140045845 A    4/2014
(Continued)

OTHER PUBLICATIONS

International Search Report for Application No. PCT/KR2019/012199 dated Dec. 24, 2019.
(Continued)

*Primary Examiner* — Victor A Mandala
*Assistant Examiner* — Lawrence C Tynes, Jr.
(74) *Attorney, Agent, or Firm* — CANTOR COLBURN LLP

(57) ABSTRACT

A display panel includes a display area in which a plurality of pixels is disposed, a non-display area disposed outside the display area, a plurality of protrusions protruding from the non-display area and disposed along an edge of the non-display area, and a first driver disposed in the non-display area and including a plurality of first stages respectively corresponding to the plurality of protrusions.

20 Claims, 10 Drawing Sheets

(51) Int. Cl.
  *H01L 51/52* (2006.01)
  *H10K 50/84* (2023.01)
  *H10K 59/121* (2023.01)
  *H10K 59/131* (2023.01)

(58) Field of Classification Search
  CPC ...... H10K 59/121; H10K 59/00; H10K 99/00; H10K 50/00; H10K 77/111; H10K 2102/311
  See application file for complete search history.

(56) References Cited

U.S. PATENT DOCUMENTS

| | | | |
|---|---|---|---|
| 10,162,386 | B2 | 12/2018 | Chong et al. |
| 2014/0152646 | A1 | 6/2014 | Kang et al. |
| 2015/0091012 | A1 | 4/2015 | Namkung et al. |
| 2017/0075464 | A1* | 3/2017 | Ahn ................. G06F 3/04164 |
| 2017/0278918 | A1* | 9/2017 | Jeon ................. H10K 59/40 |

FOREIGN PATENT DOCUMENTS

| | | |
|---|---|---|
| KR | 1020160127276 A | 11/2016 |
| KR | 1020170005281 A | 1/2017 |
| KR | 1020170047269 A | 5/2017 |
| KR | 1020170064623 A | 6/2017 |
| KR | 1020170065058 A | 6/2017 |
| KR | 1020170139702 A | 12/2017 |
| WO | 2017183775 A1 | 10/2017 |

OTHER PUBLICATIONS

Written Opinion for Application No. PCT/KR2019/012199 dated Dec. 24, 2019.

* cited by examiner

DISPLAY PANEL

This application is a national stage application of International Patent Application No. PCT/KR2019/012199, filed on Sep. 20, 2019, which claims priority to Korean Patent Application No. 10-2018-0121480, filed on Oct. 12, 2018, and all the benefits accruing therefrom under 35 U.S.C. § 119, the content of which in their entirety is herein incorporated by reference.

BACKGROUND

1. Field

Embodiments relate to a display device. More particularly, embodiments relate to a display panel applied to a curved display device.

2. Description of the Related Art

With a development of information technology, an importance of a display device as a connecting medium between users and information has emerged. A use of display device such as a liquid crystal display device, an organic light emitting display device, etc., is increasing.

A flexible display device that is easy to carry and may be applied to electronic devices of various shapes is in the spotlight as a next-generation display device. In particular, a curved display device may realize an image not only from a front surface but also from a side surface by bending an edge of a display panel.

Recently, as users' design demands are diversified, the display panel may be bent along a plurality of bending axes.

SUMMARY

When the display panel is bent along the bending axes in order to manufacture a curved display device, a crack may occur due to concentration of stress at an intersection where the bending axes intersect.

A feature of the present invention is to provide a display panel with reduced stress at a region where bending axes intersect.

In order to achieve the feature of the invention described above, a display panel in embodiments may include a display area in which a plurality of pixels are disposed, a non-display area disposed outside the display area, a plurality of protrusions protruding from the non-display area and provided along an edge of the non-display area, and a first driver disposed in the non-display area and including a plurality of first stages respectively corresponding to the plurality of protrusions.

In an embodiment, the display panel may further include a first driver control signal line disposed in the non-display area and supplying a first driver control signal to the first driver.

In an embodiment, the first driver control signal line may be disposed between the first driver and the edge of the non-display area, and may extend along the plurality of protrusions.

In an embodiment, the first driver control signal line may be spaced apart from the edge of the non-display area in a predetermined distance.

In an embodiment, the display panel may further include a second driver disposed in the non-display area, disposed between the first driver and the display area, and including a plurality of second stages respectively corresponding to the plurality of protrusions.

In an embodiment, the display panel may further include a second driver control signal line disposed in the non-display area and supplying a second driver control signal to the second driver. In an embodiment, the second driver control signal line may be disposed between the first driver and the second driver.

In an embodiment, the second driver control signal line may windingly extend along the plurality of protrusions.

In an embodiment, one of the first driver and the second driver may be a scan driver, and another of the first driver and the second driver may be an emission driver.

In an embodiment, the display panel may further include a voltage line disposed in the non-display area, disposed between the first driver and the display area, and supplying a voltage to the plurality of pixels.

In an embodiment, the voltage line may straightly extend along a boundary between the non-display area and the display area.

In an embodiment, the display panel may further include a thin film encapsulation layer covering the plurality of pixels.

In an embodiment, an edge of the thin film encapsulation layer may be disposed on the edge of the non-display area.

In an embodiment, an edge of the thin film encapsulation layer may be disposed in the non-display area between the first driver and the display area.

In order to achieve the feature of the invention described above, a display panel in embodiments may include a flat area in which an image is displayed, a first curved area adjacent to a side of the flat area, a second curved area adjacent to a corner of the flat area and the first curved area, and a plurality of protrusions protruding from the second curved area and provided along an edge of the second curved area.

In an embodiment, the display panel may further include a driver disposed in the second curved area and including a plurality of stages respectively corresponding to the plurality of protrusions.

In an embodiment, the display panel may further include a driver control signal line disposed in the second curved area and supplying a driver control signal to the driver. The driver control signal line may be disposed between the driver and the edge of the second curved area, and may extend along the plurality of protrusions.

In an embodiment, the first curved area may be bent along a first bending axis extending along a first direction, and the second curved area may be bent along the first bending axis and a second bending axis extending along a second direction intersecting the first direction.

In an embodiment, the corner of the flat area may be rounded.

In an embodiment, the first curved area may be a display area, and the second curved area may be anon-display area.

In the display panel in the embodiments, the plurality of protrusions may be provided along the edge of the second curved area that is bent along the intersecting bending axes, so that stress applied to the second curved area may be distributed, and the second curved area may not be cracked.

In the display panel in the embodiments, the stages of the driver may respectively correspond to the plurality of protrusions, so that an extent of the non-display area may decrease, and a dead space may decrease.

BRIEF DESCRIPTION OF THE DRAWINGS

The above and other embodiments, advantages and features of this disclosure will become more apparent by describing in further detail embodiments thereof with reference to the accompanying drawings, in which.

DETAILED DESCRIPTION

Figure 1:
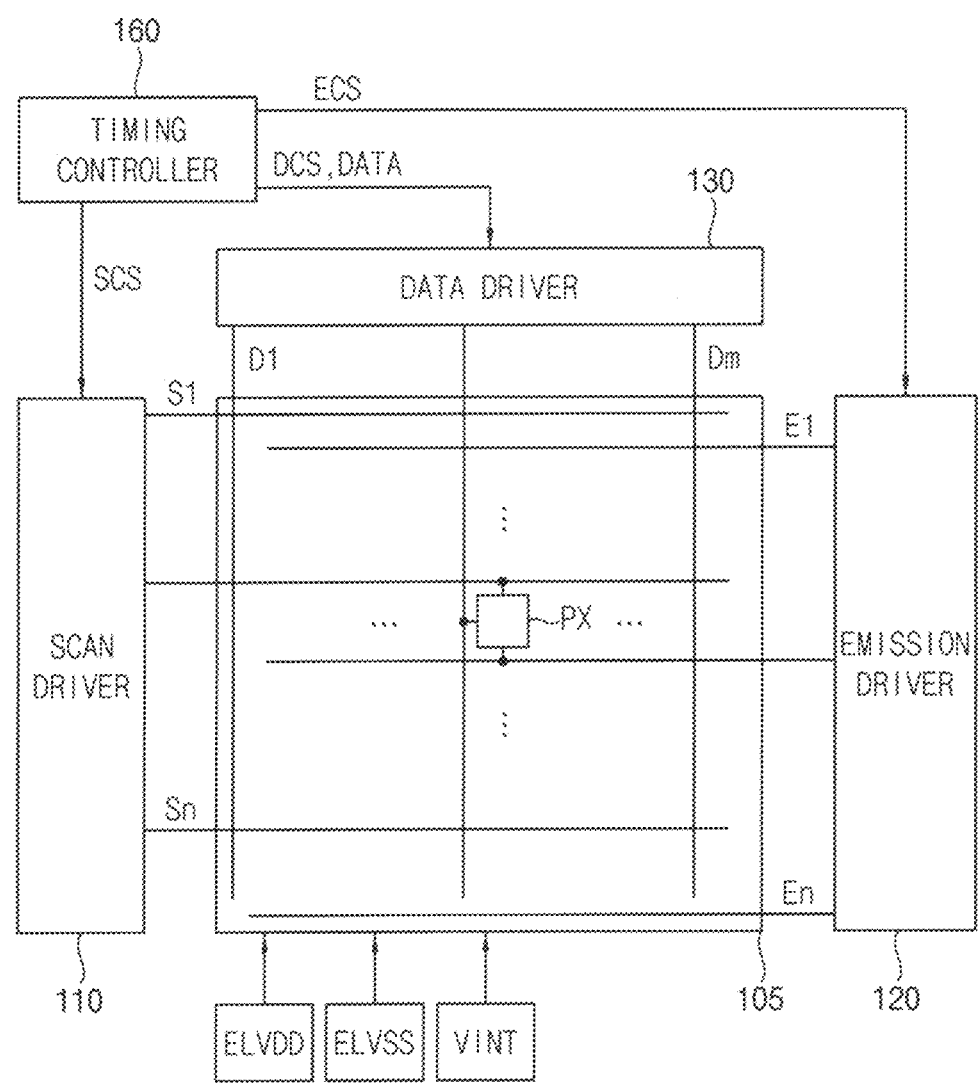
FIG. 1 is a block diagram illustrating an embodiment of a display device.

Hereinafter, display panels and display devices including the same in embodiments of the invention will be explained in detail with reference to the accompanying drawings.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third," etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Hereinafter, elements of a display device in an embodiment will be described in detail with reference to FIGS. 1 to 4.

FIG. 1 is a block diagram illustrating an embodiment of a display device.

Referring to FIG. 1, a display device in an embodiment may include a display unit 105, a scan driver 110, an emission driver 120, a data driver 130, and a timing controller 160.

The display unit 105 may include a plurality of pixels PX The pixels PX may be connected to scan lines S1 to Sn, emission lines E1 to En, and data lines D1 to Dm where n and m are natural numbers. Further, the pixels PX may be connected to a first power source ELVDD, a second power source ELVSS, and a third power source VINT.

The pixels PX may receive scan signals from the scan lines S1 to Sn, and may receive data signals synchronized with the scan signals from the data lines D1 to Dm. The pixel PX receiving the data signal may control the amount of driving current flowing from the first power source ELVDD to the second power source ELVSS via an organic light emitting diode (not shown), and the organic light emitting diode may generate light with a luminance corresponding to the amount of the driving current.

The scan driver 110 may supply the scan signals to the scan lines S1 to Sn in response to a scan driver control signal SCS from the timing controller 160. In an embodiment, the scan driver 110 may sequentially supply the scan signals to the scan lines S1 to Sn, for example. When the scan signals are sequentially supplied to the scan lines S1 to Sn, the pixels PX may be sequentially selected in units of horizontal lines.

The emission driver 120 may supply emission signals to the emission lines E1 to En in response to an emission driver control signal ECS from the timing controller 160. In an embodiment the emission driver 120 may sequentially supply the emission signals to the emission lines E1 to En, for example.

The data driver 130 may supply the data signals to the data lines D1 to Dm in response to a data driver control signal DCS. The data signals supplied to the data lines D1 to Dm may be supplied to the pixels PX selected by each scan signal. Accordingly, the data driver 130 may supply the data signals to the data lines D1 to Dm in synchronization with the scan signals.

The timing controller 160 may generate the scan driver control signal SCS, the emission driver control signal ECS, and the data driver control signal DCS in response to control signals supplied from the outside. The scan driver control signal SCS may be supplied to the scan driver 110, the emission driver control signal ECS may be supplied to the emission driver 120, and the data driver control signal DCS may be supplied to the data driver 130. Further, the timing controller 160 may convert image data input from the outside into image data that meets the specifications of the data driver 130, and may supply the converted image data to the data driver 130.

The scan driver control signal SCS may include a scan start signal and clock signals. The scan start signal may control a supply timing of the scan signals, and the clock signals may be used to shift the scan start signal.

The emission driver control signal ECS may include an emission start signal and clock signals. The emission start signal may control a supply timing of the emission signals, and the clock signals may be used to shift the emission start signal.

The data driver control signal DCS may include a source start signal, a source output enable signal, a source sampling clock, or the like. The source start signal may control a data sampling start time point of the data driver 130. The source output enable signal may control an output timing of the data driver 130. The source sampling clock may control a sampling operation of the data driver 130 based on a rising edge or a falling edge.

Figure 2:
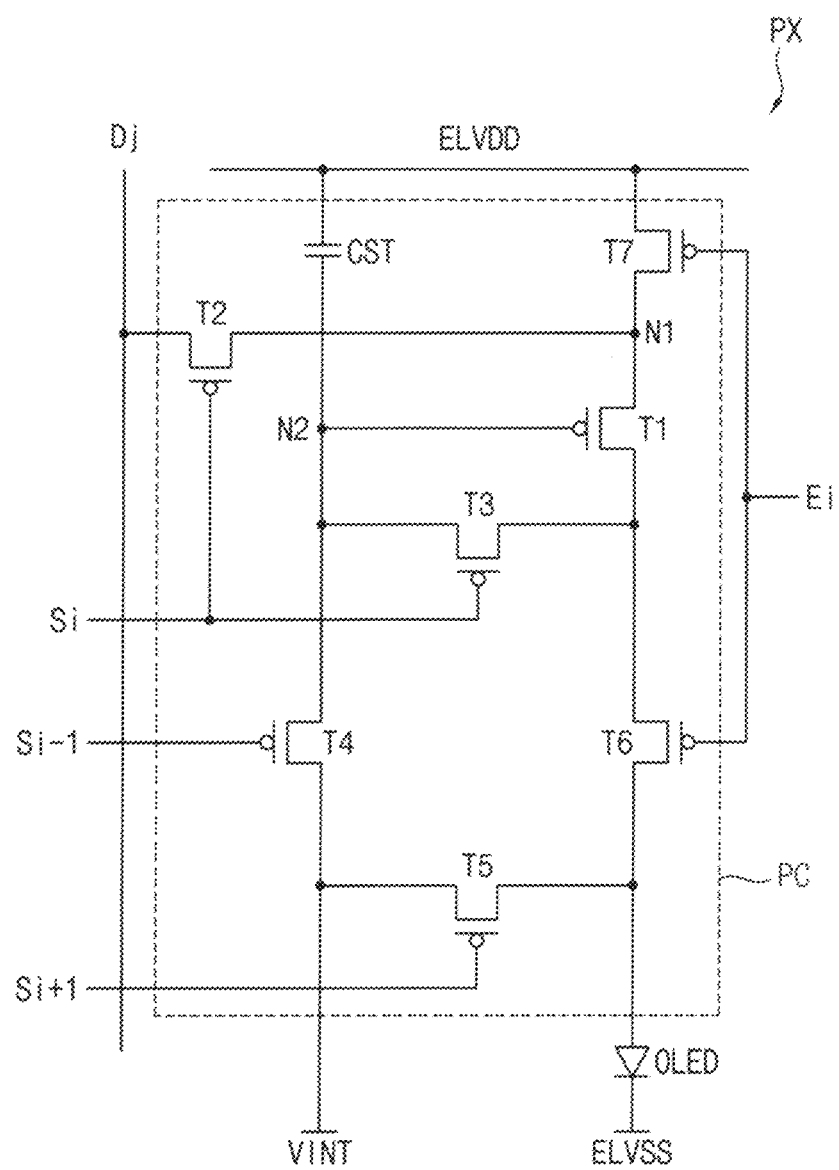
FIG. 2 is a circuit diagram illustrating a pixel of the display device in FIG. 1.

FIG. 2 is a circuit diagram illustrating the pixel PX of the display device in FIG. 1.

FIG. 2 illustrates a pixel PX disposed in an i-th pixel row and a j-th pixel column for convenience of description. Here, i is a natural number equal to or greater than 1 and equal to or less than n, and j is a natural number equal to or greater than 1 and equal to or less than m.

Referring to FIG. 2, the pixel PX may include a pixel circuit PC and an organic light emitting diode OLED.

The pixel circuit PC may control an amount of driving current flowing from the first power source ELVDD to the second power source ELVSS through the organic light emitting diode OLED in response to the data signal. The pixel circuit PC may include a first transistor T1, a second transistor T2, a third transistor T3, a fourth transistor T4, a fifth transistor T5, a sixth transistor T6, a seventh transistor T7, and a storage capacitor CST.

A first electrode of the first transistor T1 (the driving transistor) may be connected to a first node N1, and a second electrode of the first transistor T1 may be connected to a first electrode of the sixth transistor T6. The gate electrode of the first transistor T1 may be connected to a second node N2. The first transistor T1 may control the amount of the driving current flowing from the first power source ELVDD to the second power source ELVSS through the organic light emitting diode OLED in response to a data signal supplied to the j-th data line Dj.

The second transistor T2 may be connected between the j-th data line Dj and the first node N1. In other words, the second transistor T2 may be connected between the first electrode of the first transistor T1 and the j-th data line Dj. A gate electrode of the second transistor T2 may be connected to an i-th scan line S1. The second transistor T2 may be turned on when a scan signal is supplied to the i-th scan line S1 to electrically connect the j-th data line Dj and the first node N1.

The third transistor T3 may be connected between the second electrode of the first transistor T1 and the second node N2. In other words, the third transistor T3 may be connected between the gate electrode of the first transistor T1 and the second electrode of the first transistor T1. A gate electrode of the third transistor T3 may be connected to the i-th scan line S1. The third transistor T3 may be turned on when the scan signal is supplied to the i-th scan line S1 to diode-connect the first transistor T1.

The fourth transistor T4 may be connected between the second node N2 and the third power source VINT. In other words, the fourth transistor T4 may be connected between the gate electrode of the first transistor T1 and the third power source VINT. A gate electrode of the fourth transistor T4 may be connected to the (i−1)-th scan line Si−1. The fourth transistor T4 may be turned on when the scan signal is supplied to the (i−1)-th scan line Si−1 to supply a voltage of the third power source VINT to the second node N2.

The fifth transistor T5 may be connected between an anode electrode of the organic light emitting diode OLED and the third power source VINT. A gate electrode of the fifth transistor T5 may be connected to the (i+1)-th scan line Si+1. The fifth transistor T5 may be turned on when the scan signal is supplied to the (i+1)-th scan line Si+1 to supply the voltage of the third power source VINT to the anode electrode of the organic light emitting diode OLED. In another embodiment, the gate electrode of the fifth transistor T5 may be connected to the (i−1)-th scan line Si−1 or the i-th scan line Si. The voltage of the third power source VINT may be set to a voltage lower than that of the data signal.

The sixth transistor T6 and the seventh transistor T7 may be disposed in a path of the driving current, and may allow the driving current to flow in response to an emission signal supplied to the i-th emission line Ei.

The sixth transistor T6 may be connected between the second electrode of the first transistor T1 and the anode electrode of the organic light emitting diode OLED. A gate electrode of the sixth transistor T6 may be connected to the i-th emission line Ei. The sixth transistor T6 may be turned on when the emission signal is supplied to the i-th emission line Ei.

The seventh transistor T7 may be connected between the first power source ELVDD and the first node N1. In other words, the seventh transistor T7 may be connected between the first power source ELVDD and the first electrode of the first transistor T1. A gate electrode of the seventh transistor T7 may be connected to the i-th emission line Ei. The seventh transistor T7 may be turned on when the emission signal is supplied to the i-th emission line Ei.

The storage capacitor CST may be connected between the first power source ELVDD and the second node N2. In other words, the storage capacitor CST may be connected between the first power source ELVDD and the gate electrode of the first transistor T1. The storage capacitor CST may store the data signal and a voltage corresponding to the threshold voltage of the first transistor T1.

The anode electrode of the organic light emitting diode OLED may be connected to the pixel circuit PC, and a cathode electrode of the organic light emitting diode OLED may be connected to the second power source ELVSS. The organic light emitting diode OLED may generate light with a predetermined luminance in response to the driving current supplied from the pixel circuit PC. The first power source ELVDD may be set to have a higher voltage than that of the second power source ELVSS so that current may flow through the organic light emitting diode OLED.

Figure 3:
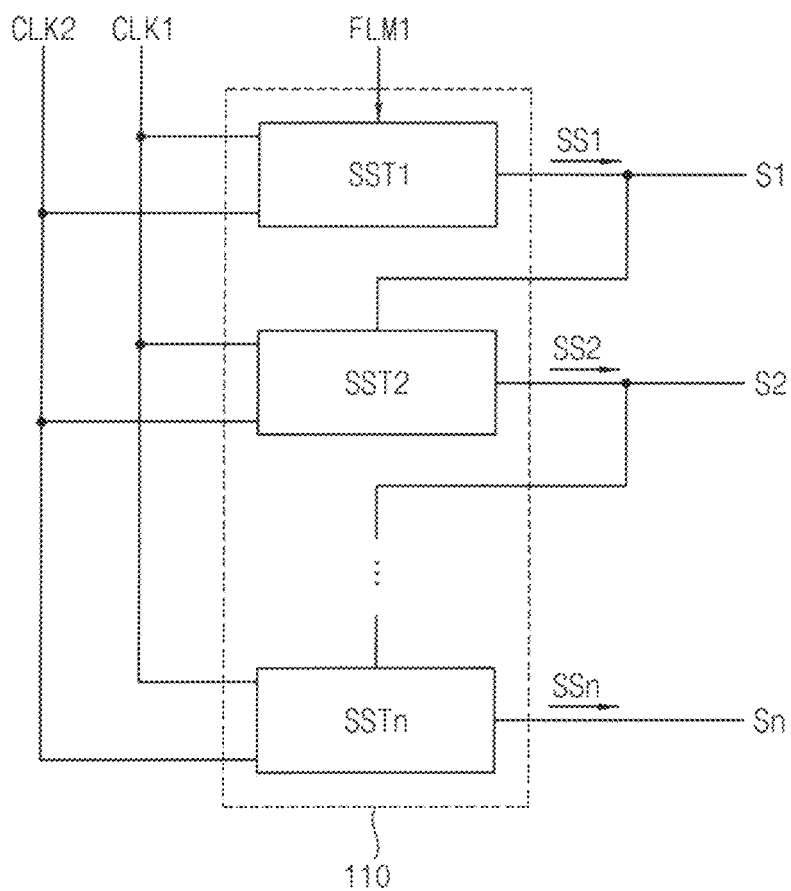
FIG. 3 is a block diagram illustrating a scan driver of the display device in FIG. 1.

FIG. 3 is a block diagram illustrating the scan driver 110 of the display device in FIG. 1.

Referring to FIG. 3, the scan driver 110 may include a plurality of scan stages SST1 to SSTn. The scan stages SST1 to SSTn may be connected to ends of the scan lines S1 to Sn, respectively, and may supply scan signals SS1 to SSn to the scan lines S1 to Sn. The scan stages SST1 to SSTn may be operated in response to clock signals CLK1 and CLK2 supplied from the timing controller 160. The scan stages SST1 to SSTn may be implemented with the same circuit.

The scan stages SST1 to SSTn may receive an output signal (i.e., a scan signal) of a previous scan stage or a scan start signal FLM1. In an embodiment, the first scan stage SST1 may receive the scan start signal FLM1, and the remaining scan stages SST2 to SSTn may receive the output signals of the previous scan stage, for example.

Figure 4:
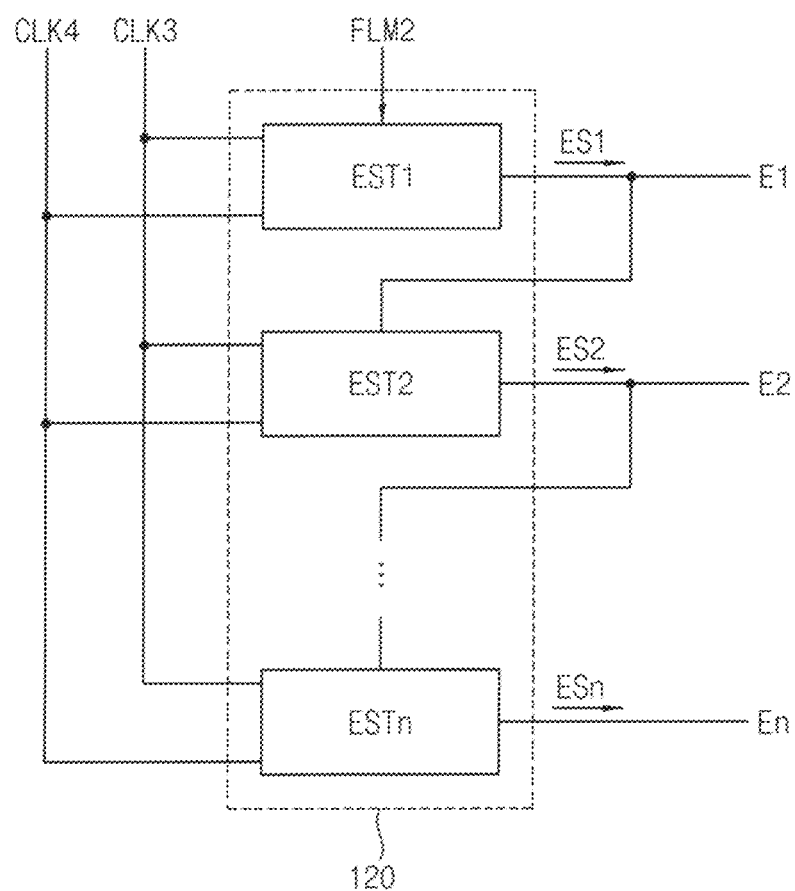
FIG. 4 is a block diagram illustrating an emission driver of the display device in FIG. 1.

FIG. 4 is a block diagram illustrating the emission driver 120 of the display device in FIG. 1.

Referring to FIG. 4, the emission driver 120 may include a plurality of emission stages EST1 to ESTn.

The emission stages EST1 to ESTn may be connected to ends of the emission lines E1 to En, respectively, and may supply emission signals ES1 to ESn to the emission lines E1 to En. The emission stages EST1 to ESTn may be operated in response to clock signals CLK3 and CLK4 supplied from the timing controller 160. The emission stages EST1 to ESTn may be implemented with the same circuit.

The emission stages EST1 to ESTn may receive an output signal (i.e., an emission signal) of the previous emission stage or an emission start signal FLM2. In an embodiment, the first emission stage EST1 may receive the emission start signal FLM2, and the remaining emission stages EST2 to ESTn may receive the output signals of the previous emission stage, for example.

Hereinafter, regions of a display panel included in the display device in an embodiment will be described in detail with reference to FIGS. 5 to 7.

Figure 5:
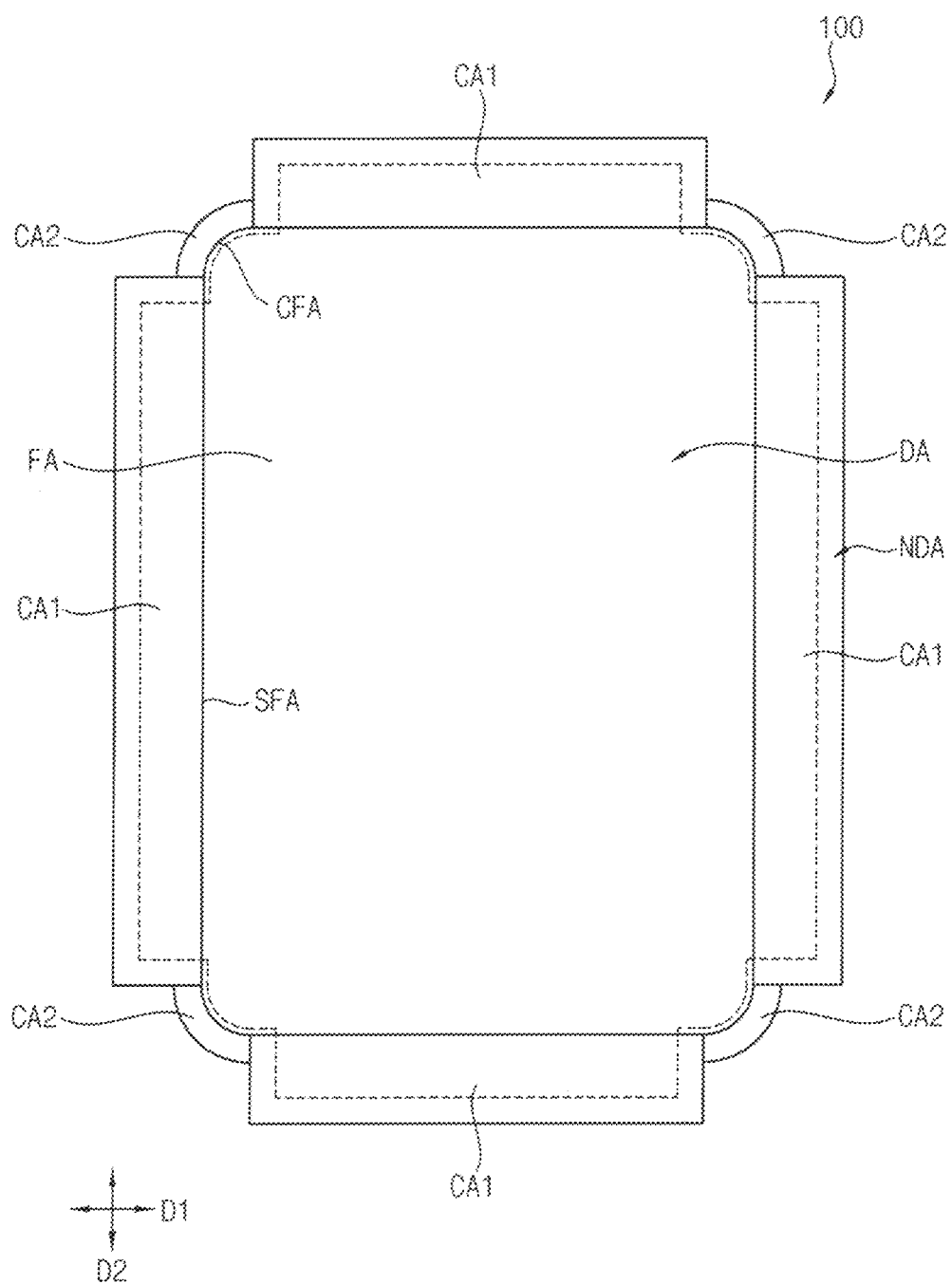
FIG. 5 is a plan view illustrating an embodiment of an embodiment of a display panel.

FIG. 5 is a plan view illustrating an embodiment of a display panel. FIG. 6 is a plan view illustrating the display panel in FIG. 5 in a bent state. FIG. 7 is a perspective view illustrating the display panel in FIG. 5 in a bent state.

Figure 6:
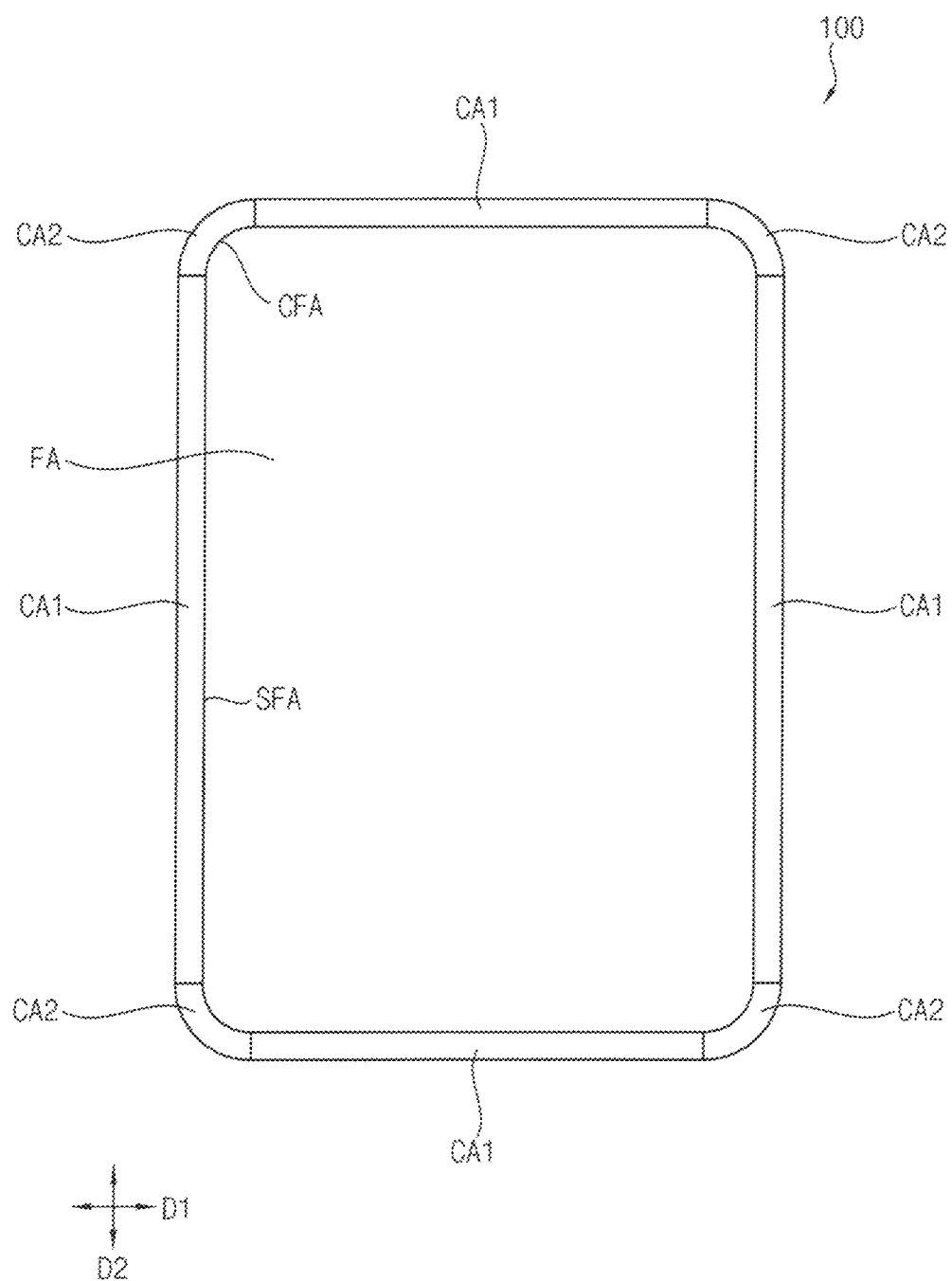
FIG. 6 is a plan view illustrating the display panel in FIG. 5 in a bent state.
Figure 7:
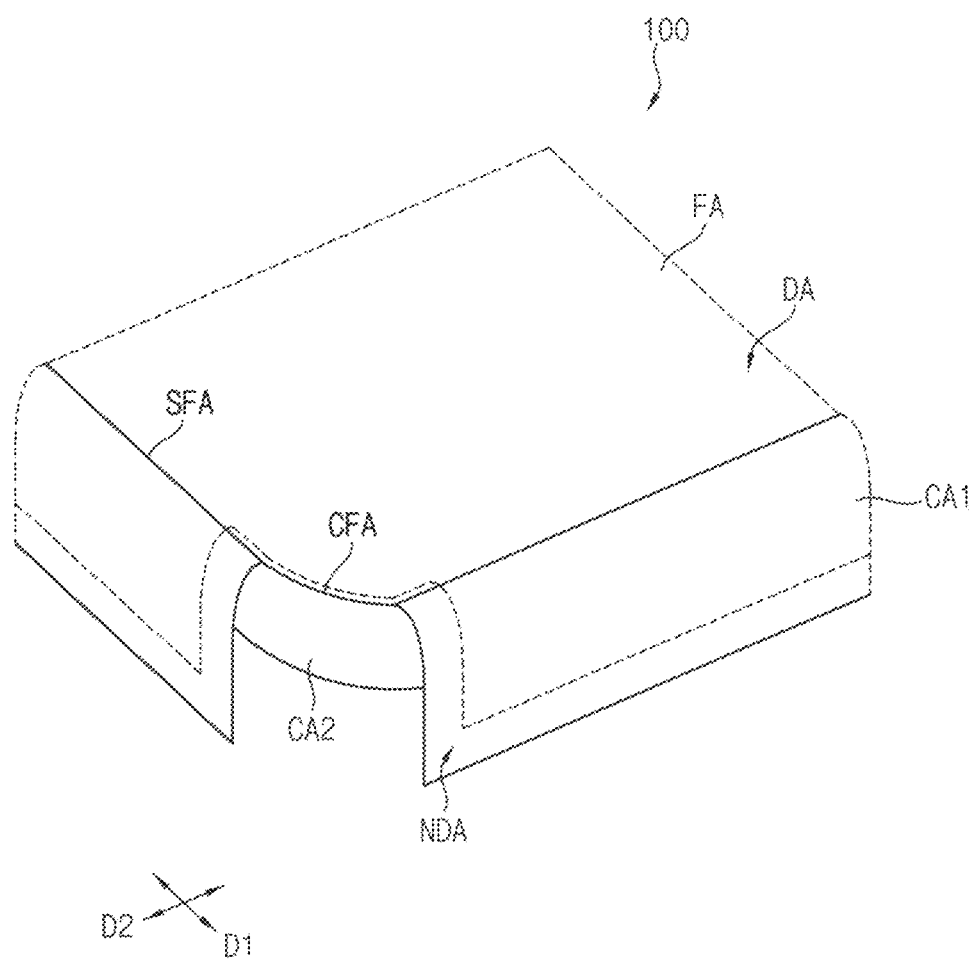
FIG. 7 is a perspective view illustrating the display panel in FIG. 5 in a bent state.

Referring to FIGS. 5, 6, and 7, a display panel 100 in an embodiment may include a flat area FA, a first curved area CA1, and a second curved area CA2. The display device in the embodiment described with reference to FIGS. 1 to 4 may include the display panel 100 in the illustrated embodiment.

The flat area FA may have a quadrangular (e.g., rectangular) shape in a plan view. The flat area FA may have four sides SFA and four corners CFA. In an embodiment, the corner CFA of the flat area FA may be rounded.

When the display panel 100 is bent, the flat area FA may not be bent. Accordingly, the flat area FA may have a flat shape even when the display panel 100 is bent.

The first curved area CA1 may be adjacent to the side SFA of the flat area FA In an embodiment, the display panel 100 may include four first curved areas CA1 respectively adjacent to the four sides SFA of the flat area FA, for example. The first curved areas CA1 may be disposed in a first direction D1 or a second direction D2 intersecting the first direction D1 from the flat area FA. The first curved area CA1 may have a quadrangular (e.g., rectangular) shape in a plan view.

When the display panel 100 is bent, the first curved area CA1 may be bent. The first curved area CA1 may be bent along a bending axis extending in the first direction D1 or the second direction D2. In an embodiment, the first curved areas CA1 disposed in the first direction D1 from the flat area FA may be bent along a bending axis extending in the second direction D2, and the first curved areas CA1 disposed in the second direction D2 from the flat area FA may be bent along a bending axis extending in the first direction D1. Accordingly, the first curved area CA1 may have a two-dimensional curved shape. Here, the two-dimensional curved shape may mean a shape in which a plane is bent in one direction.

The second curved area CA2 may be adjacent to the corner CFA of the flat area FA and the first curved area CA1. The second curved area CA2 may be disposed between a first curved area CA1 disposed in the first direction D1 from the flat area FA and a first curved area CA1 disposed in the second direction D2 from the flat area FA. In an embodiment, the display panel 100 may include four second curved areas CA2 adjacent to four corners CFA of the flat area FA, for example. The second curved area CA2 adjacent to the corner CFA of the rounded flat area FA may have a sector shape in a plan view.

When the display panel 100 is bent, the second curved area CA2 may be bent. The second curved area CA2 may be bent along a first bending axis extending in the first direction D1 and a second bending axis extending in the second direction D2. Accordingly, the second curved area CA2 may have a three-dimensional curved shape. Here, the three-dimensional curved shape may mean a shape in which a plane is bent in two or more directions.

The above-described display unit 105 may be disposed in the flat area FA and the first curved area CA1. Specifically, the display unit 105 may be disposed in an entirety of the flat area FA, and may be disposed in a portion of the first curved area CA1 adjacent to the flat area FA Accordingly, a display area DA may be defined in the entirety of the flat area FA and the portion of the first curved area CA1 adjacent to the flat area FA (inside an area surrounded by dotted lines in FIGS. 5 and 7). A plurality of pixels PX may be disposed in the display area DA Accordingly, an image may be displayed in the flat area FA and the first curved area CA1.

The scan driver 110 and the emission driver 120 described above may be disposed in the first curved area CA1 and the second curved area CA2. Specifically, the scan driver 110 and the emission driver 120 may be disposed in a portion of the first curved area CA1 and an entirety of the second curved area CA2 spaced apart from the flat area FA. Accordingly, a non-display area NDA may be defined in the portion of the first curved area CA1 and the entirety of the second curved area CA2 spaced apart from the flat area FA (outside of the area surrounded by dotted lines in FIGS. 5 and 7). Accordingly, an image may not be displayed in the second curved area CA2. Further, the non-display area NDA may be disposed outside the display area DA.

Hereinafter, the flat area FA and the second curved area CA2 of the display panel 100 will be described in detail with reference to FIGS. 8 to 11.

Figure 8:
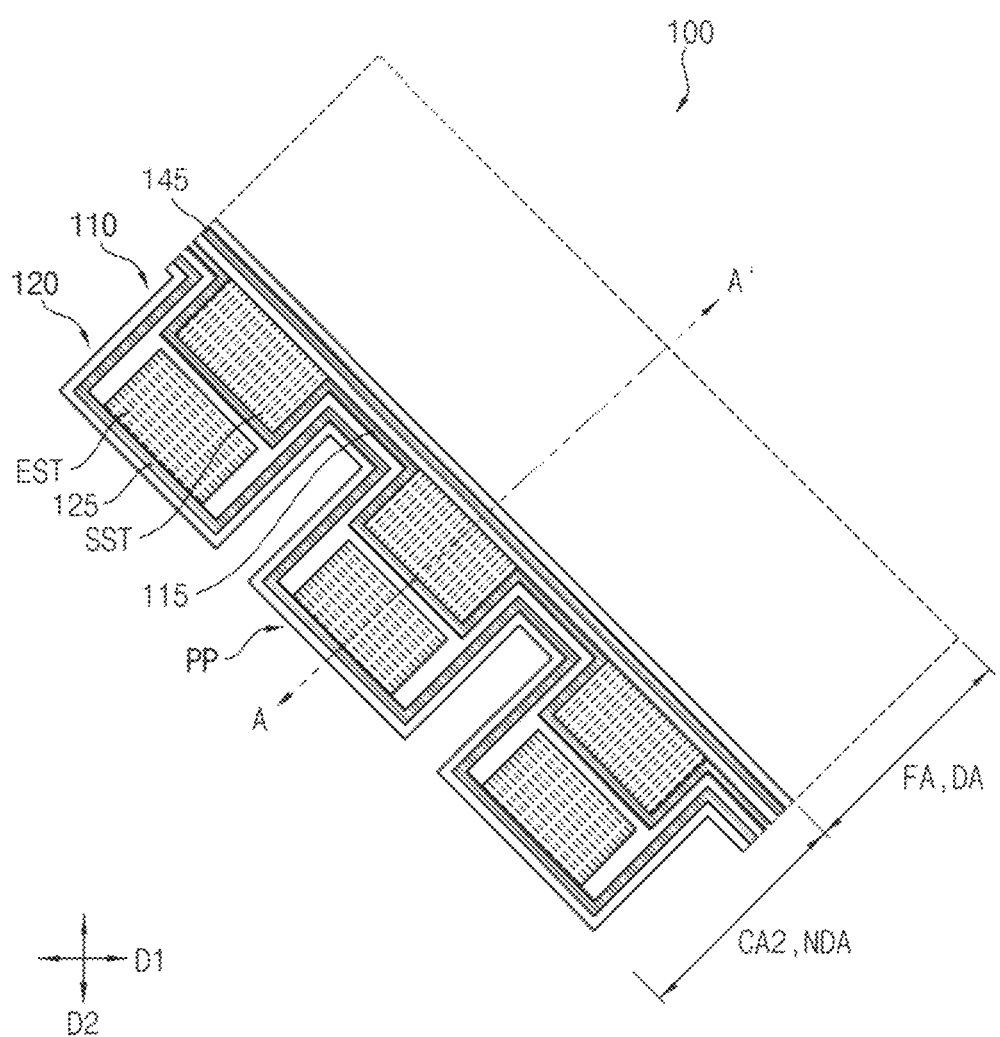
FIG. 8 is a plan view illustrating an embodiment of a portion of a display panel.
Figure 9:
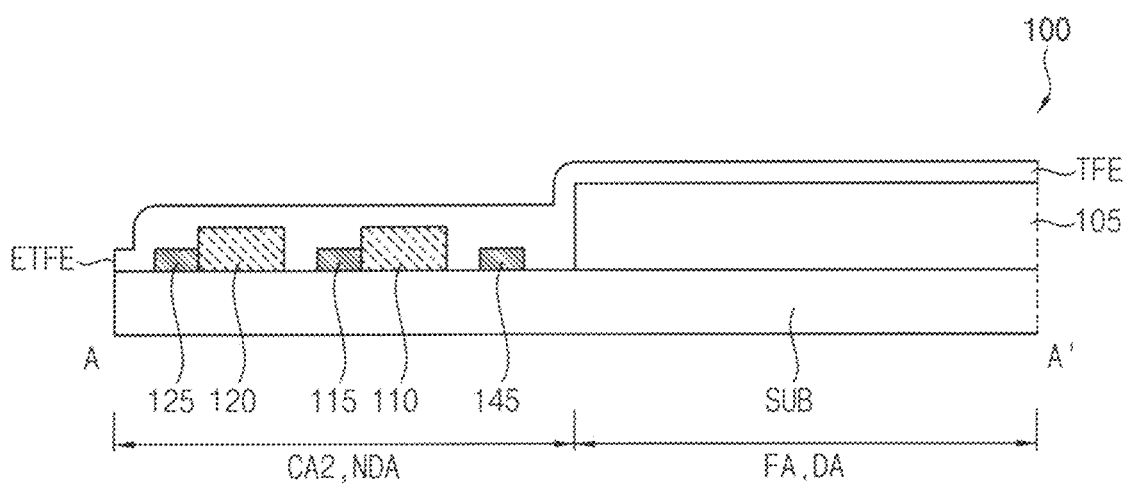
FIG. 9 is a cross-sectional view illustrating an embodiment of a portion of a display panel.

FIG. 8 is a plan view illustrating an embodiment of a portion of a display panel. FIG. 9 is a cross-sectional view illustrating an embodiment of a portion of a display panel. In an embodiment, FIG. 8 may be a plan view illustrating the second curved area CA2 that is the non-display area NDA and a portion of the flat area FA that is the display area DA adjacent to the second curved area CA2, for example. FIG. 9 may be a cross-sectional view illustrating an embodiment of the display panel 100 taken along line A-A' in FIG. 8.

Referring to FIGS. 8 and 9, a display panel 100 in an embodiment may include a substrate SUB, a display unit 105, a scan driver 110, a scan driver control signal line 115, an emission driver 120, an emission driver control signal line 125, a voltage line 145, and a thin film encapsulation layer TFE.

The display unit 105 may be disposed in the flat area FA on the substrate SUB. In an embodiment, the substrate SUB may include a plastic material having flexibility. In an embodiment, the substrate SUB may include polyethersulfone ("PES"), polyactylate ("PAR"), polyetherimide ("PEI"), polyethylene naphthalate ("PEN"), polyethylene terephthalate ("PET"), polyphenylene sulfide ("PPS"), polyarylate, polyimide ("PI"), polycarbonate ("PC"), cellulose triacetate ("TAC"), cellulose acetate propionate ("CAP"), or the like, for example.

A plurality of protrusions PP protruding from the second curved area CA2 may be provided in the second curved area CA2. The protrusions PP may be provided along an edge of the second curved area CA2. The protrusions PP may be spaced apart from each other in constant intervals therebetween. Accordingly, the edge of the second curved area CA2 may have an uneven shape.

As described above, when the second curved area CA2 is bent, the second curved area CA2 may be bent along bending axes intersecting each other, and accordingly, stress may be applied to the second curved area CA2. When the edge of the second curved area CA2 has a linear shape, stress may be concentrated on the edge of the second curved area CA2, and cracks may occur in the second curved area CA2. However, in the embodiment of the invention, the protrusions PP may be provided in the second curved area CA2, and accordingly, the edge of the second curved area CA2 may have the uneven shape. Therefore, when the second curved area CA2 is bent along the bending axes intersecting each other, stress applied to the second curved area CA2 may be distributed, and cracks may not occur in the second curved area CA2.

The emission driver 120 may be disposed in the second curved area CA2 on the substrate SUB. As described above, the emission driver 120 may include a plurality of emission stages EST.

The emission stages EST may respectively correspond to the protrusions PP. In an embodiment, each of the emission stages EST may be disposed in each of the protrusions PP, for example. Accordingly, the emission stages EST may be spaced apart from each other in constant intervals therebetween. In an embodiment, one emission stage EST may correspond to each of the protrusions PP.

The emission driver control signal line 125 may be disposed in the second curved area CA2 on the substrate SUB. The emission driver control signal line 125 may supply the emission driver control signal ECS to the emission driver 120. Further, the emission driver control signal line 125 may electrically connect the emission stages EST spaced apart from each other.

In an embodiment, the emission driver control signal line 125 may be disposed between the emission driver 120 and the edge of the second curved area CA2, and may extend along the protrusions PP. In an embodiment, the emission driver control signal line 125 may extend along the uneven shape of the edge of the second curved area CA2, for example. Accordingly, the emission driver control signal line 125 may windingly extend along the edge of the second curved area CA2.

In an embodiment, the emission driver control signal line 125 may be spaced apart from the edge of the second curved area CA2 by a predeteimined distance. In such an embodiment, the emission driver control signal line 125 may have substantially the same shape as that of the edge of the second curved area CA2. As the emission driver control signal line 125 is spaced apart from the edge of the second curved area CA2 by the predetermined distance, a free space for cutting the substrate SUB may be secured during the manufacturing process.

The scan driver 110 may be disposed in the second curved area CA2 on the substrate SUB. The scan driver 110 may be disposed between the emission driver 120 and the flat area FA. As described above, the scan driver 110 may include a plurality of scan stages SST.

The scan stages SST may respectively correspond to the protrusions PP. In an embodiment, at least a portion of each of the scan stages SST may be disposed in each of the protrusions PP, for example. Accordingly, the scan stages SST may be spaced apart from each other in constant intervals therebetween. In an embodiment, one scan stage SST may correspond to each of the protrusions PP.

The scan driver control signal line 115 may be disposed in the second curved area CA2 on the substrate SUB. The scan driver control signal line 115 may supply the scan driver control signal SCS to the scan driver 110. Further, the scan driver control signal line 115 may electrically connect the scan stages SST spaced apart from each other.

In an embodiment, the scan driver control signal line 115 may be disposed between the emission driver 120 and the scan driver 110. In an embodiment, the scan driver control signal line 115 may be disposed between the emission driver control signal line 125 and the flat area FA, for example. The scan driver control signal line 115 may windingly extend along the protrusions PP. In an embodiment, the scan driver control signal line 115 may windingly extend around sides of the scan stages SST, for example.

In an embodiment, as illustrated in FIG. 8, the emission driver 120 may be disposed closer to the edge of the second curved area CA2 than the scan driver 110 is to the edge of the second curved area CA2. However, the invention is not limited thereto, and in another embodiment, the scan driver 110 may be disposed closer to the edge of the second curved area CA2 than the emission driver 120 is to the edge of the second curved area CA2. In such another embodiment, the scan driver control signal line 115 may be disposed closer to the edge of the second curved area CA2 than the emission driver control signal line 125 is to the edge of the second curved area CA2.

When the scan stages SST of the scan driver 110 and the emission stages EST of the emission driver 120 are adjacent to each other and disposed outside the protrusions PP, and the scan driver control signal line 115 and the emission driver control signal line 125 extend in a linear shape and are disposed outside the protrusions PP, since a free space for disposing the scan driver 110, the scan driver control signal line 115, the emission driver 120, and the emission driver control signal line 125 is desired to be secured, the extent of the non-display area NDA may increase. However, in the embodiment of the invention, the scan stages SST of the scan driver 110 and the emission stages EST of the emission driver 120 may be spaced apart from each other and disposed inside the protrusions PP, and the scan driver control signal line 115 and the emission driver control signal line 125 may windingly extend along the protrusions PP, so that the extent of the non-display area NDA may decrease, and accordingly, the dead space may decrease.

The voltage line 145 may be disposed in the second curved area CA2 on the substrate SUB. The voltage line 145 may be disposed between the emission driver 120 and the flat area FA. In an embodiment, the voltage line 145 may be disposed adjacent to the flat area FA between the scan driver 110 and the flat area FA, for example. The voltage line 145 may supply voltage to the pixels PX disposed in the flat area FA. In an embodiment, the voltage line 145 may be connected to the above-described first power source ELVDD to supply a voltage of the first power source ELVDD to the pixels PX or the above-described third power source VINT to supply a voltage of the third power source VINT to the pixels PX, for example.

In an embodiment, the voltage line 145 may straightly extend along a boundary between the second curved area CA2 and the flat area FA. The voltage line 145 disposed adjacent to the flat area FA may be spaced apart from the protrusions PP. Accordingly, the voltage line 145 may straightly extend regardless of the uneven shape of the edge of the second curved area CA2.

The thin film encapsulation layer TFE may be disposed on the display unit 105 to cover the pixels PX The thin film encapsulation layer IFE may protect the organic light emitting diodes respectively included in the pixels PX from impurities such as oxygen and moisture. The thin film encapsulation layer TFE may include at least one inorganic layer and at least one organic layer. In an embodiment, the thin film encapsulation layer TFE may include a first inorganic layer, a second inorganic layer disposed on the first inorganic layer, and an organic layer disposed therebetween, for example.

The thin film encapsulation layer TFE may extend from the flat area FA to the second curved area CA2. In this case, an edge ETFE of the thin film encapsulation layer TFE may be disposed in the second curved area CA2.

In an embodiment, the edge ETFE of the thin film encapsulation layer TFE may be disposed on the edge of the second curved area CA2. In an embodiment, the edge ETFE of the thin film encapsulation layer TFE may be disposed parallel to the edge of the second curved area CA2, for example. In such an embodiment, the thin film encapsulation layer TFE may cover the drivers 110 and 120 and the lines 115, 125, and 145 disposed in the second curved area CA2. Accordingly, the thin film encapsulation layer TFE may protect the drivers 110 and 120 and the lines 115, 125, and 145 from impurities such as oxygen and moisture.

Figure 10:
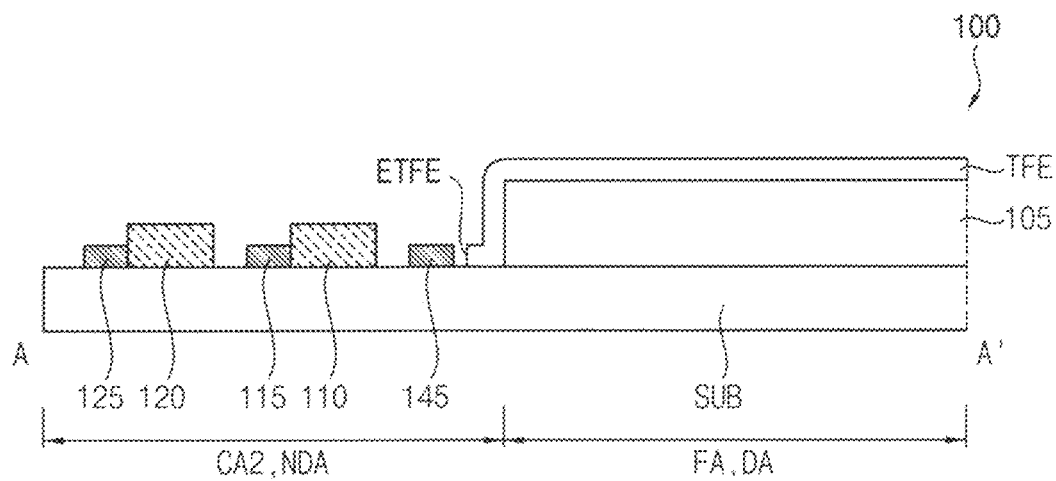
FIG. 10 is a cross-sectional view illustrating an embodiment of a portion of a display panel.

FIG. 10 is a cross-sectional view illustrating a portion of a display panel. In an embodiment, FIG. 10 may be a cross-sectional view illustrating another embodiment of the display panel taken along line A-A' in FIG. 8, for example.

In another embodiment, the edge ETFE of the thin film encapsulation layer TFE may be disposed between the emission driver 120 and the flat area FA In an embodiment, the edge E of the thin film encapsulation layer TFE may be disposed between the voltage line 145 adjacent to the flat area FA and the flat area FA, for example. In such another embodiment, the thin film encapsulation layer TFE may not cover the drivers 110 and 120 and the lines 115, 125, and 145 disposed in the second curved area CA2. However, an encapsulation member (not shown) covering the drivers 110 and 120 and the lines 115, 125, and 145 may be disposed in the second curved area CA2 on the substrate SUB to protect the drivers 110 and 120 and the lines 115, 125, and 145 from impurities such as oxygen and moisture.

Figure 11:
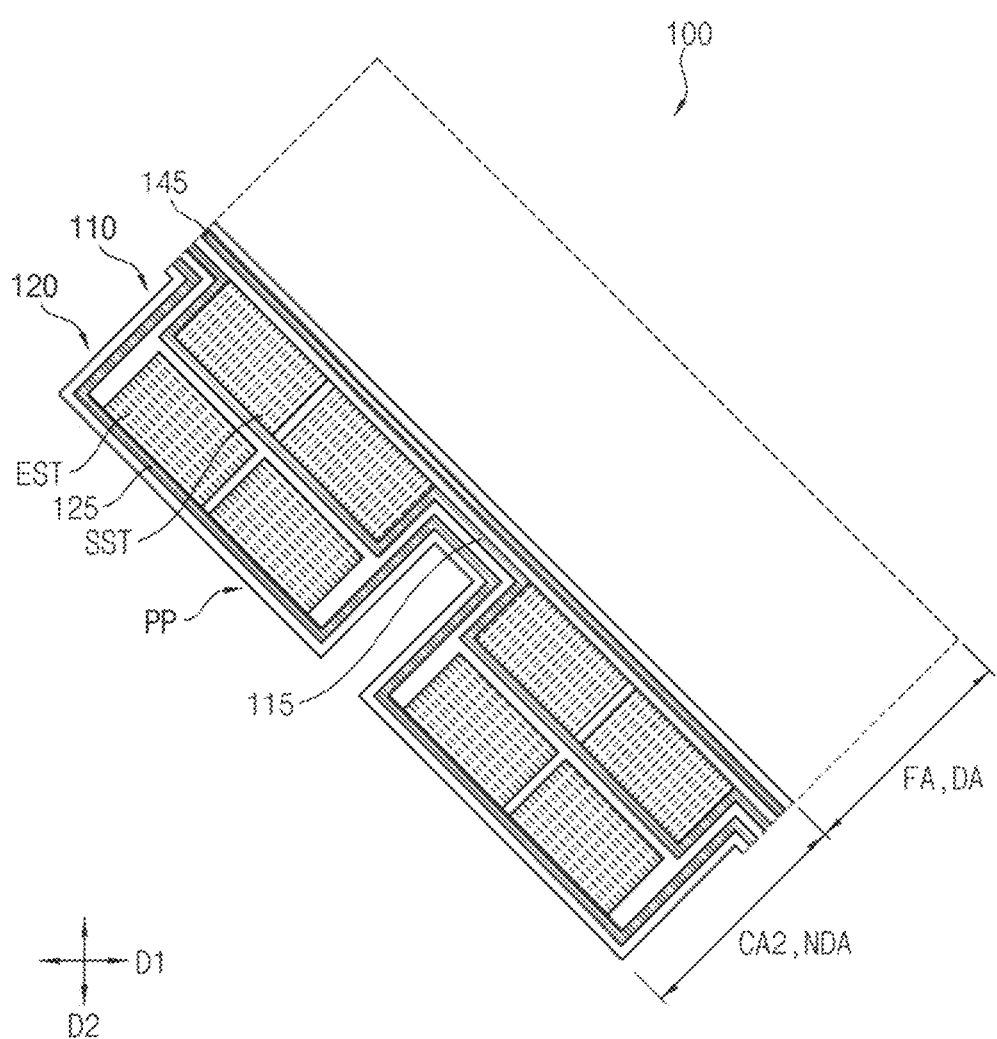
FIG. 11 is a plan view illustrating an embodiment of a portion of a display panel.

FIG. 11 is a plan view illustrating an embodiment of a portion of a display panel.

Referring to FIG. 11, in another embodiment, a plurality of emission stages EST and a plurality of scan stages SST may correspond to each of the protrusions PP. In an embodiment, as illustrated in FIG. 11, two emission stages EST and two scan stages SST may correspond to each of the protrusions PP, for example. However, the invention is not limited thereto, and three or more emission stages EST and three or more scan stages SST may correspond to each of the protrusions PP.

The display device in the embodiments of the invention may be applied to a display device included in a computer, a notebook, a mobile phone, a smartphone, a smart pad, a portable multimedia player ("PMP"), a personal digital assistance ("PDA"), an MP3 player, or the like.

Although the display panels and the display devices including the same in the embodiments of the invention have been described with reference to the drawings, the illustrated embodiments are examples, and may be modified and changed by a person having ordinary knowledge in the relevant technical field.

The invention claimed is:

1. A display panel, comprising:
a display area in which a plurality of pixels is disposed;
a non-display area disposed outside the display area;
a plurality of protrusions protruding from the non-display area and provided along an outer edge of the non-display area opposite to an inner edge of the non-display area facing the display area; and
a first driver disposed in the non-display area and including a plurality of first stages respectively including at least portions disposed inside the plurality of protrusions.

2. The display panel of claim 1, further comprising:
a first driver control signal line which is disposed in the non-display area and supplies a first driver control signal to the first driver.

3. The display panel of claim 2, wherein the first driver control signal line is disposed between the first driver and the edge of the non-display area and extends along the plurality of protrusions.

4. The display panel of claim 2, wherein the first driver control signal line is spaced apart from the edge of the non-display area in a predetermined distance.

5. The display panel of claim 1, further comprising:
a second driver disposed in the non-display area, disposed between the first driver and the display area, and including a plurality of second stages respectively corresponding to the plurality of protrusions.

6. The display panel of claim 5, further comprising:
a second driver control signal line which is disposed in the non-display area and supplies a second driver control signal to the second driver.

7. The display panel of claim 6, wherein the second driver control signal line is disposed between the first driver and the second driver.

8. The display panel of claim 6, wherein the second driver control signal line windingly extends along the plurality of protrusions.

9. The display panel of claim 5, wherein one of the first driver and the second driver is a scan driver, and a remaining one of the first driver and the second driver is an emission driver.

10. The display panel of claim 1, further comprising:
a voltage line which is disposed in the non-display area, disposed between the first driver and the display area, and supplies a voltage to the plurality of pixels.

11. The display panel of claim 10, wherein the voltage line straightly extends along a boundary between the non-display area and the display area.

12. The display panel of claim 1, further comprising:
a thin film encapsulation layer covering the plurality of pixels.

13. The display panel of claim 12, wherein an edge of the thin film encapsulation layer is disposed on the edge of the non-display area.

14. The display panel of claim 12, wherein an edge of the thin film encapsulation layer is disposed in the non-display area between the first driver and the display area.

15. A display panel, comprising:
a flat area in which an image is displayed;
a first curved area adjacent to a side of the flat area;
a second curved area adjacent to a corner of the flat area and the first curved area; and
a plurality of protrusions protruding from the second curved area and provided along an edge of the second curved area.

16. The display panel of claim 15, further comprising:
a driver disposed in the second curved area and including a plurality of stages respectively corresponding to the plurality of protrusions.

17. The display panel of claim 16, further comprising:
a driver control signal line which is disposed in the second curved area and supplies a driver control signal to the driver,
wherein the driver control signal line is disposed between the driver and the edge of the second curved area and extends along the plurality of protrusions.

18. The display panel of claim 15, wherein the first curved area is bent along a first bending axis extending along a first direction, and
wherein the second curved area is bent along the first bending axis and a second bending axis extending along a second direction intersecting the first direction.

19. The display panel of claim 15, wherein the corner of the flat area is rounded.

20. The display panel of claim 15, wherein the first curved area is a display area, and
wherein the second curved area is a non-display area.

* * * * *